United States Patent [19]
Kushner

[11] 4,400,632
[45] Aug. 23, 1983

[54] METHOD AND LOGIC CIRCUIT FOR CONVERTING SIGNALS

[76] Inventor: Jury K. Kushner, ulitsa Khersonskaya, 25, kv. 62, Moscow, U.S.S.R.

[21] Appl. No.: 306,472

[22] Filed: Sep. 28, 1981

Related U.S. Application Data

[63] Continuation of Ser. No. 950,281, Oct. 11, 1978.

[51] Int. Cl.³ .......................................... H03K 19/20
[52] U.S. Cl. ............................... 307/299 A; 307/445; 307/303
[58] Field of Search ........... 307/445, 446, 455, 299 A, 307/203

[56] References Cited

U.S. PATENT DOCUMENTS

| | | | |
|---|---|---|---|
| 3,629,609 | 12/1971 | Pedersen | 307/299 A |
| 3,719,830 | 3/1973 | Ananiades | 307/299 A |
| 3,746,885 | 7/1973 | Stopper | 307/299 A |
| 3,795,822 | 3/1974 | Skokan | 307/215 |
| 3,828,202 | 8/1974 | Stopper | 307/299 A |

Primary Examiner—Stanley D. Miller
Assistant Examiner—B. P. Davis
Attorney, Agent, or Firm—Holman & Stern

[57] ABSTRACT

A method for converting signals comprising logically converting source signals, amplifying the logic signals so produced while simultaneously passing the logic signals to the output of a respective logic circuit, and voltage-summing the amplified logic signals and the produced logic signals. A logic circuit to realize the disclosed method comprises a logic arrangement in which the source signals are converted to logic signals. The output of the logic arrangement is coupled to the input of an amplifier and to at least one true output of the logic circuit, while one of the outputs of the amplifier is coupled to the true output of the logic circuit.

7 Claims, 13 Drawing Figures

METHOD AND LOGIC CIRCUIT FOR CONVERTING SIGNALS

This is a continuation of application Ser. No. 950,281, filed Oct. 11, 1978.

FIELD OF THE INVENTION

The invention relates to the computer industry, and more particularly to a method and a logic circuit for converting signals.

The invention is applicable to the design of LSI logic circuits of a very high speed to be employed in high performance fourth generation computers. Other uses are concerned with automatic devices and with measurement and radar engineering systems.

DESCRIPTION OF THE PRIOR ART

Known in the art are various methods for converting signals (cf. the article by A. I. Pressman in "Design and Development of Semiconductor Circuits for Digital Computers", Moscow, 1969, p. 141). In this known method, source voltage signals are subject to logical conversion to obtain a logic signal and the voltage level of the latter is restored when it is passed via an amplifier.

The logic circuits AND, OR, and AND-OR designed to realize this method utilize bipolar arrangements and generally comprise emitter followers and diodes. Since the latter possess a linear transfer characteristic and their voltage gain is less than unity, the level of the logic signal produced at the output of a logic arrangement is lower than the level of the source signal at its input. Note that a logic arrangement hereinafter is referred to as a simplest logic circuit which can perform functions AND, OR, and AND-OR.

An amplifier is therefore coupled to the output of a logic arrangement to restore the level of the produced logic signal. That amplifier is responsible for an additional time delay (of an appreciable value) which is several times that available in the case of the diode-emitter-coupled logic.

In order to reduce the time delay for a single logic stage, it is common practice in building logic circuits to increase the number of logic stages preceding the signal amplifier and to utilize high speed amplifiers implemented as current switches.

Known in the art are logic circuits comprising diode logic arrangements which perform the OR function and a current switch (cf. the French Pat. No. 2,220,936, cl. HO3K 19/08). Each of the known circuits comprises a logic arrangement belonging to a single logic stage and a current amplifier/switch. As a result, the time delay per a single logic stage is of a considerable value. Moreover, the known circuits consume a higher power since the source signals must be of a considerable value. There is also a large number of components incorporated in such a circuit.

The logic circuits belonging to the emitter-functional logic (cf. the U.S. Pat. No. 3,795,822) perform two functions AND-OR. These circuits comprise a small number of components since their logic arrangements utilize multiple emitter transistors. However, the circuits possess a low speed since a single current switch is available to two logic stages. Moreover, the input signal must be of an appreciable value since the transfer factor of each logic arrangement is small; as a result, power consumption is high.

There is a logic circuit (cf. the USSR Inventor's Certificate No. 333,707) comprising three logic stages, built around emitter followers and diodes, and a current switch operated as an amplifier. This circuit, however, includes a large number of components and requires the input signal of a considerable value. Moreover, the circuit possesses a rather low speed since the time delay from the current switch is supplemented to the time delay from the three logic stages.

SUMMARY OF THE INVENTION

An object of the invention is to provide for a logic circuit possessing high speed and requiring low power consumption.

Another object of the invention is to provide for a logic circuit which can perform complex logic functions.

A still another object of the invention is to provide a logic circuit having a lesser number of components.

There is disclosed a method for converting signals comprising logically converting the source signals, amplifying logic signals produced and passing the logic signals to the output of a respective logic circuit, which method comprises, according to the invention, passing the logic signals to the output of a respective logic circuit during the amplification and subjecting the amplified and the produced logic signals to voltage summation.

There is disclosed a logic circuit to realize the proposed method, comprising a logic arrangement and an amplifier which has an input coupled to an output of the logic arrangement, and has one of its outputs coupled to at least one true output of the logic circuit, the output of the logic arrangement being coupled, according to the invention, to the true output of the logic circuit.

Preferably, in a logic circuit, according to the invention, the logic arrangement having its output coupled, via a resistor, to a true output of the amplifier coupled to at least one true output of the logic circuit.

Advantageously, in a logic circuit, according to the invention, the logic arrangement having its output coupled to the true output of the logic circuit via a resistor, the true output of the amplifier being the true output of the logic circuit, and a complement output of the amplifier being coupled to the output of the logic arrangement.

Preferably, in a logic circuit, according to the invention, the logic arrangement has its output and the amplifier has its complement output both coupled to the true output of the logic circuit via the same resistor.

Advantageously, in a logic circuit, according to the invention, the logic arrangement has its output coupled to the true output of the logic circuit via a resistor and an emitter follower, connected in series, the true output of the amplifier being coupled to the true output of the logic circuit via the emitter follower.

Preferably, in a logic circuit, according to the invention, the logic arrangement comprises a multiple emitter transistor performing logical conversion and forward amplification of the signal, the collector of the multiple emitter transistor being coupled to an input of a current switch which provides for reverse amplification of the signal, and the base of the multiple emitter transistor being coupled to a complement output of the current switch.

Advantageously, in a logic circuit, according to the invention, the logic arrangement comprises a multiple emitter transistor performing logical conversion and forward amplification of the signal, the base of the multiple emitter transistor being coupled, via another resistor, to a voltage source, and the collector of the multiple emitter transistor being coupled to the input of the emitter follower.

Preferably, in a logic circuit, according to the invention, the amplifier is implemented as a current switch having its complement output coupled to at least one complement output of the logic circuit via second and third emitter followers connected in series, the third emitter follower being implemented as a multiple emitter transistor, and a still another resistor being inserted between the output of the second emitter follower and the output of the logic arrangement in order to obtain an additional voltage signal passing through the first resistor.

The disclosed method provides for a reduced time interval necessary for the restoration of the signal being passed through any one of the disclosed logic circuits, with result that the logic circuits can operate at a high speed.

The logic circuits disclosed include a smaller number of components, require low power consumption, can perform complex logic functions and possess high speed of operation.

BRIEF DESCRIPTION OF THE DRAWINGS

The invention will now be described, by way of example, with reference to the accompanying drawings in which.

DESCRIPTION OF THE INVENTION

Figure 1:
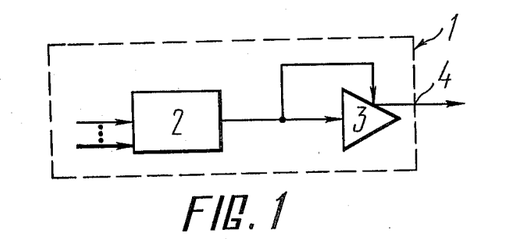
FIG. 1 shows an embodiment of a logic circuit, according to the invention.

FIG. 1 illustrates an embodiment of a logic circuit 1 of the invention to implement the disclosed method for converting signals. The logic circuit 1 comprises a logic arrangement 2 and an amplifier 3 connected in series. Those inputs of the logic arrangement 2 to which the source signals are applied serve as the inputs of the logic circuit 1, while one of the outputs of the amplifier 3 is coupled (in a direct relationship in the given embodiment) to a true output 4 of the logic circuit 1. The output of the logic arrangement 2 is coupled to the true output 4 of the logic circuit 1. This provides for the application of the logic signals obtained during the conversion of the source signals in the logic arrangement 2 to the true output 4 of the logic circuit 1 and for simultaneous amplification of the logic signals in the amplifier 3. The internal resistance of the logic arrangement 2 serves as a load for the amplifier 3.

Figure 2:
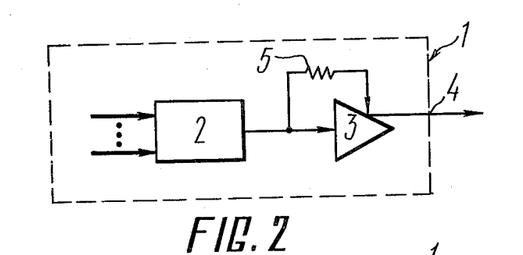
FIG. 2 shows another embodiment of a logic circuit to provide for a higher gain of the amplifier, according to the invention.

FIG. 2 illustrates another embodiment of the logic circuit 1 of the invention which comprises the logic arrangement 2 having its output coupled to the true output 4 of the logic circuit 1 via a resistor 5. The latter provides for an increase in the internal resistance of the logic arrangement 2 in order to increase the gain of the amplifier 3. A true output of the amplifier 3 is coupled directly to the true output 4 of the logic circuit 1. In this case, the working characteristics of the logic circuit 1 do not vary provided that the resistor 5 is inserted between the output of the logic arrangement 2 and the amplifier 3 and that the input of the amplifier 3 is coupled to its true output, i.e., to a true output of the logic circuit 1 (such an embodiment is not shown in FIG. 2 In this case, the logic circuit 1 offers somewhat higher noise immunity.

Figure 3:
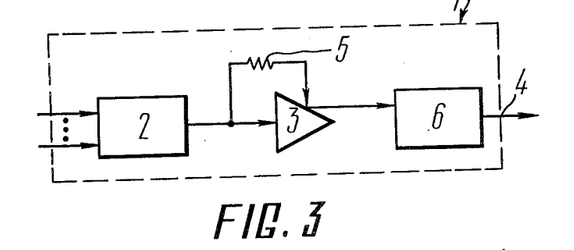
FIG. 3 shows a still another embodiment of a logic circuit comprising an output emitter follower, according to the invention.

FIG. 3 illustrates a still another version of the logic circuit 1 to the invention wherein the output of the logic arrangement 2 is coupled to the true output 4 of the logic circuit 1 via a resistor 5 and an emitter follower 6 connected in series. A true output of the amplifier 3 is coupled to the true output 4 of the logic circuit 1 via the emitter follower 6.

Figure 4:
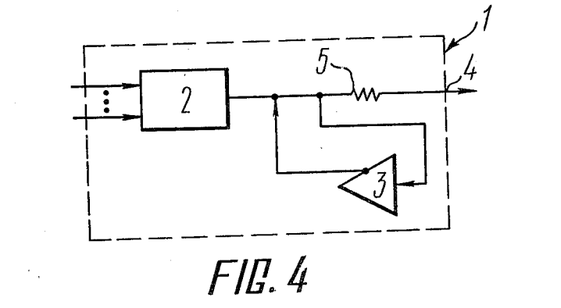
FIG. 4 shows a yet another embodiment of a logic circuit utilizing an amplifier with a negative feedback, according to the invention.

FIG. 4 illustrates a yet another embodiment of the logic circuit 1 of the invention wherein a complement output of the amplifier 3 is coupled to the output of the logic arrangement 2 which is coupled to the true output of the logic circuit 1 via the resistor 5. Like the above embodiments, the input of the amplifier 3 is coupled to the output of the logic arrangement 2; however, it is possible to connect the input of the amplifier 3 to the output of the logic arrangement 2 via the reistor 5 (such an embodiment is not shown in FIG. 4) and the noise immunity of the logic circuit is increased in this case. Note that in the embodiment according to FIG. 3 the connection of the amplifier 3 with a positive feedback to the output of the logic arrangement 2 results in a deterioration of the frequency characteristic of the logic arrangement 2; on the other hand, the embodiment of FIG. 4 is freed of this drawback since the amplifier 3 has a negative feedback; in the latter case, however, there is an increase in the loss of the magnitude of the logic signal in the logic arrangement 2.

Figure 5:
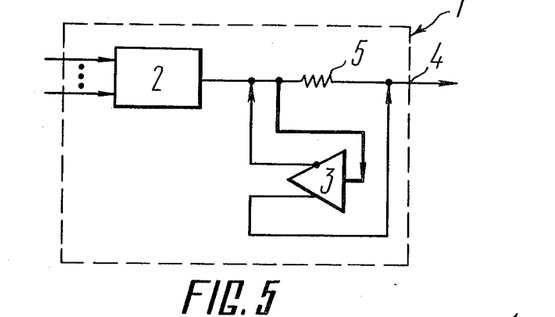
FIG. 5 shows another embodiment of a logic circuit with an amplifier having ture and complement outputs and a negative and positive feedback, according to the invention.

FIG. 5 illustrates another embodiment of the logic circuit 1 of the invention which has no drawbacks found in the embodiments of FIGS. 3 and 4. In the embodiment of FIG. 5, use is made of the true and complement outputs of the amplifier 3 concurrently. The output of the logic arrangement 2 and the complement output of the amplifier 3 are coupled to the true output 4 of the logic circuit 1 via the resistor 5. The true output of the amplifier 3 is coupled directly to the true output 4 of the logic circuit 1. The input of the amplifier 3 is coupled directly to the output of the logic arrangement 2. As a result, the logic circuit 1 of the described embodiment (FIG. 5) has a high transfer factor as in the case of the embodiment of FIG. 3, while the logic arrangement 2 possesses a good frequency characteristic similar to that of the embodiment of FIG. 4.

Figure 6:
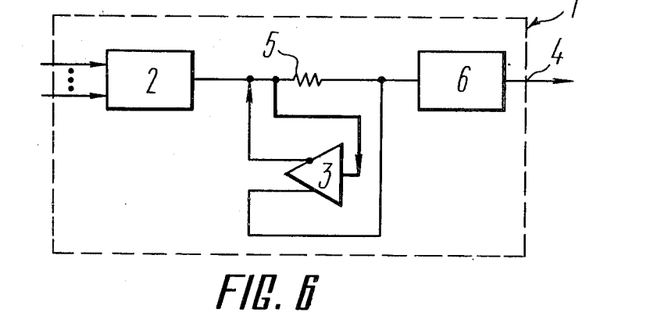
FIG. 6 shows a still another embodiment of a logic circuit possessing a higher speed of operation and a low output impedance, according to the invention.

FIG. 6 illustrates another embodiment of the logic circuit 1 of the invention wherein the output of the logic arrangement 2 is coupled to the true output 4 of the logic arrangement 2 via the resistor 5 and an emitter follower 6. The true output of the amplifier 3 is coupled to the true output 4 of the logic circuit 1 via the emitter follower 6.

The emitter follower 6 (FIGS. 3,6) makes it possible to decrease the output impedance of the logic circuit 1 and, therefore, to decrease the time delay of the logic signal in the case where a load is available.

Figure 7:
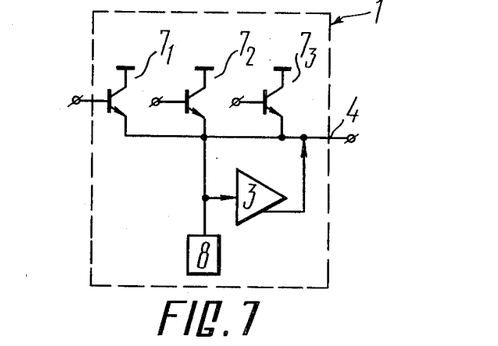
FIG. 7 is a circuit diagram of an AND gate built around emitter followers, according to the invention.

FIG. 7 illustrates a circuit diagram of the embodiment of FIG. 2 performing the AND function. The logic arrangement 2 (FIG. 7) is built around emitter followers $7_1$ to $7_m$ where m is an integer number equal to the number of the inputs of the logic circuit 1, namely, to 3. The emitter followers $7_1$ to $7_3$ have their bases used as the inputs of the logic circuit 1, and have their emitters joined together and coupled to the direct output 4 of the logic circuit 1 and to a current source 8. The input and the true output of the amplifier 3 are coupled to the output of the logic arrangement 2, i.e., to the true output 4 of the logic circuit 1.

Figure 8:
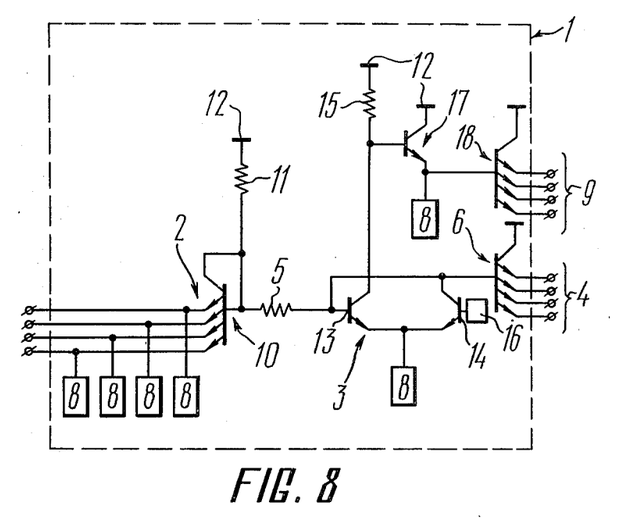
FIG. 8 shows a circuit diagram of an AND-OR/AND-OR-Invert gate with a logic arrangement built around multiple enutter transistors, according to the invention.

FIG. 8 illustrates a circuit diagram of the embodiment of FIG. 3. The logic circuit 1 (FIG. 8) performs a complex function AND-OR/AND-OR-Invert since here both the true output 4 and a complement output 9 of the logic circuit 1 produce output signals. The logic arrangement 2 utilizing a multiple emitter transistor 10 which is part there of and performs the OR function. The emitters of the multiple emitter transistor 10 are coupled to respective current sources 8 and serves as the inputs of the logic circuit 1. The transistor 10 has its collector joined together with its base and coupled, via a resistor 11, to a common bus 12 and, via a resistor 5, to the input and the true output of the amplifier 3 which is a current switch built around two transistors 13 and 14. The current switch also comprises a resistor 15 which provides a means of coupling the transistor 13 to the common bus 12, and a current source 8 coupled to the emitters of the transistors 13 and 14. The base of the transistor 14 is coupled to a reference voltage source 16. The true output of the amplifier 3, namely, the collector of the transistor 14, is coupled, via the emitter follower 6 built around a multiple emitter transistor, to the true outputs 4 of the logic circuit 1 which serve as the emitters of that multiple emitter transistor. Coupled to the compement output of the amplifier 3, namely, to the collector of the transistor 13, is an emitter follower 17 used to effect matching between the voltage levels at the inputs rand the complement outputs 9 of the logic circuit 1. The emitter follower 17 is built around a transistor having its collector and emitter coupled respectively to the common bus 12 and to its own current source 8. The output of the emitter follower 17 is coupled to an emitter follower 18 utlizing a multiple emitter transistor having its emitters coupled directly to the complement outputs 9 of the logic circuit 1. As shown in FIG. 8, the logic arrangement 2 of the logic circuit 1 utilizes three multiple emitter transistors. The first logic stage built around the emitter followers 18 and 6 performs the "wired" AND function; this can be attained by joining together the complement outputs 9 and the true outputs 4 of the logic circuit 1 with respective complement and true outputs of other logic circuits which are signal sources (the latter logic circuits are not shown in the drawings). The second logic stage performing the OR function utilizes a diode-coupled multiple emitter transistor 10. The embodiment of FIG. 8, as compared to that of FIG. 7, is advantageous since it can perform a complex logic function with inversion. Since the emitter followers 4, 9 are connected to the output of the logic circuit 1, and not to the input of the latter, this then results in a decrease on the output impedance of the logic circuit 1 and allows for the use of multiple emitter transistors as emitter followers with the result that the number of components and logic contacts in the logic circuit 1 is decreased.

Figure 9:
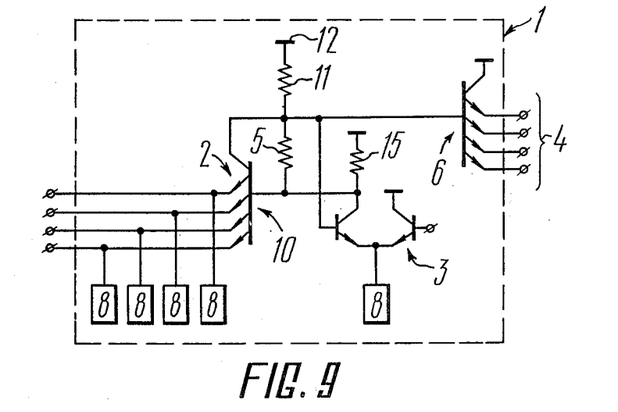
FIG. 9 shows a circuit diagram of an AND/OR gate with an input multiple emitter transistor performing logical conversion and amplification of the signal according to the invention.

FIG. 9 illustrates a circuit diagram of the the embodiment of FIG. 6 used to perform the AND-OR function. The collector of the multiple emitter transistor 10 is coupled to its base, which is the output of the logic arrangement 2, via the resistor 5 and is coupled to the common bus 12 via the resistor 11.

The transistor 10 operates concurrently to perform the OR function and to accomplish forward amplification of the signal. A current switch performing reverse amplification of the signal has its complement output coupled to the output of the logic arrangement 2, namely, to the base of the multiple emitter transistor 10. The emitter follower 6 is made as a multiple emitter transistor. The output of the logic arrangement 2, namely, the base of the multiple emitter transistor 10, is coupled to the true outputs of the logic circuit 1 via the resistor 5 and the emitter follower 6.

Figure 10:
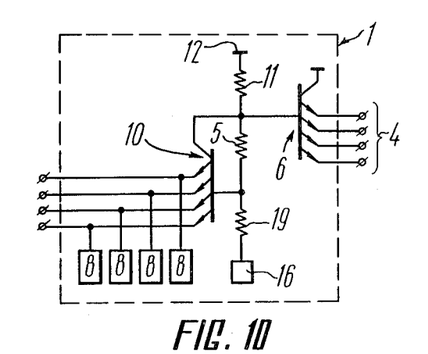
FIG. 10 shows a circuit diagram of a logic circuit having no amplifier, according to the invention.

FIG. 10 illustrates a circuit diagram of the logic circuit 1 of the invention similar to that of FIG. 9 and performing the AND-OR function. Here, however, there is no amplifier 3, while the base of the multiple emitter transistor 10 (FIG. 10) is coupled to a voltage source 16 via a resistor 19. The multiple emitter transistor 10 is used to perform concurrently logical conversion and amplification. As compared to the above logic circuits 1, the logic circuit 1 of FIG. 10 possesses the highest speed of operation since the input capacitances available from the amplifier 3 are not present in this case. In addition, this logic circuit 1 includes a smaller number of components.

Figure 11:
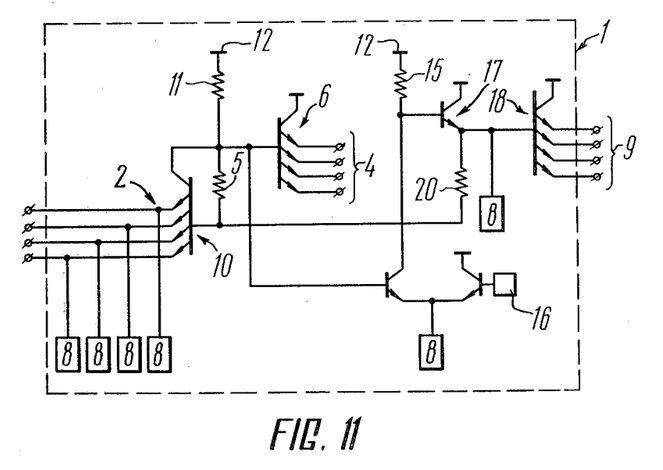
FIG. 11 shows a circuit diagram of an AND-OR/AND-OR-Invert gate with a complement output used for a recovery of the signal provided by a true output, according to the invention.

FIG. 11 illustrates an embodiment of the logic circuit 1 of the invention performing the AND-OR/AND-OR-Invert function. In this embodiment, as compared to those of FIGS. 8 and 9, a resistor 20 inserted between the output of the emitter follower 17 and the base of the multiple emitter transistor 10 is used to create an additional voltage signal passing through the resistor 5.

Figure 12:
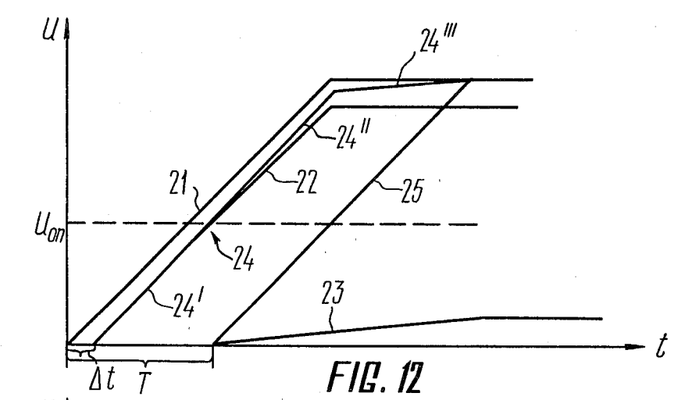
FIG. 12 shows timing diagrams for different points of a logic circuit, according to the invention.

FIG. 12 illustrates the timing diagrams according to which the disclosed method of converting signals is effected with the help of the logic circuit 1 of the invention. The time delay, t, of the logic signal is read along the abscissa, while the amplitude, U, of the source and the logic signal is read along the ordinate. Source signals 21 applied to the inputs of the logic circuit 1 are subject to logical conversion in the logic arrangement 2 with the result that logic signals 22 (logic 1's or logic 0's) are produced. The produced logic signal 22 has a value less than that of the source signal 21 since the logic arrangement 2 introduces a loss due to the internal resistance of its elements. Developed across the internal resistance of the logic arrangement 2, i.e., the load of the amplifier 3, is a voltage signals 23. The latter and the logic signal 22 are subject to voltage summation and the true output of the logic circuit 1 produces an output logic signal 24 equal to the sum of the signals 22 and 23. The timing diagrams show that the disclosed method makes it possible to restore practically without delay the level of the logic signal 22 so as its full amplitude is obtained. The portion 24' is substantially similar to the portion 21 and these portions are separated by the tme delay $\Delta t$ resulted from the logic arrangement 2. The portion 24" has a greater steepness, as compared to the source signals 21, due to the fact that the transients from the signals 22, 23 are superimposed. The portion 24''' has the edge steepness determined by the parameters of the amplifier 3. Since the latter has a small gain, the edge steepness of the signal 23 is less than that of the source signals 21. As a result, the portion 24''' features a most flat portion of the signal 24. In practice, the logic arrangements 2 of integrated circuits with bipolar transistors utilize emitter followers and diodes which, when working into even small capacitance-type loads, tend to transmit signals with spikes the edge steepness of the portion 24''' practically does not differ from that of the source signals. The above described logic circuits are characterized, at small capacitance-type loads, by an extremely small time delay, $\Delta t$, close to the transit time characteristic of the transistors. The output logic signal 24 at the true output 4 of the logic circuit 1 (FIG. 1) therefore has a shape practically identical with that of the source signals 21 (FIG. 12). FIG. 12 also shows a graph 25 for conventional logic circuits, having a time delay exceeding the time delay, $\Delta t$, characteristic of the signal produced by the logic circuit 1.

Figure 13:
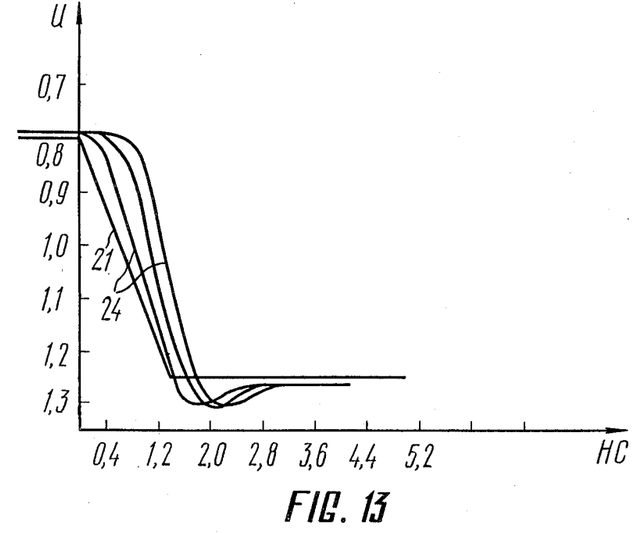
FIG. 13 shows a series of characteristic curves of a chain of gates, according to the invention.

FIG. 13 illustrates a series of curves that describe how the output logic signal 24 passes through a chain incorporating logic circuits 1 utilizing emitter followers and diodes and performing the 4AND-4OR function.

The proposed method can be used in building logic circuits of AND-OR type which have a considerably higher speed of operation. The signal delay time for such circuits can be reduced to a value close to the transistor transit time.

The logic circuit 1 of the invention operates in the following manner. The source signals 21 (FIG. 12) are applied to the inputs of the logic arrangement 2 (FIG. 1) which converts them into logic signals 22 (FIG. 12). The logic signals 22 are applied to the true output 4 of the logic circuit 1 and to the input of the amplifier 3 (FIG. 1) whose load is the internal resistance of the logic arrangement 2. Developed across the above internal resistance is the voltage signal 23 to which the logic signal 22 (FIG. 12) is added at the true output of the logic circuit 1 (FIG. 1). As a result, the delay time, $\Delta t$, of the output logic signal 24 as related to the source signal 21, is considerably reduced, which finally provides for a higher speed of operation of computers.

The embodiment of the logic circuit 1 of FIG. 1 uses only the simplest logic arrangements, either AND or OR; this is due to the fact that a higher gain of the amplifier 3 cannot be obtained with this circuit.

The embodiment of the logic circuit 1 of FIG. 2 can give a higher gain since the resistor 5 is connected in series with the internal resistance of the logic arrangement 2. Increasing the load resistance of the amplifier 3 results in an increase in the level of the voltage signal 23. This allows for the use of complex logic arrangements type AND-OR in the logic circuits 1.

The emitter follower 6 coupled to the output of the logic circuit 1 (FIG. 3) causes a decrease in its output impedance so that the delay time, $\Delta t$, tends to rise slowly at the moment that a load is connected to the output of the logic circuit. Other advantages of this embodiment have been described above.

With the amplifier 3 (FIGS. 1, 2, 3) having a positive feedback at the output of the logic arrangement 2, the frequency characteristic of the latter deteriorates and the time delay resulted from the logic arrangement 2 is increased. This drawback is eliminated in the embodiment of FIG. 4 wherein the amplifier 3 has its complement output coupled to the output of the logic arrangement 2. In this case, the sign of the voltage across the resistor 5, which is added to the logic signal 22 (FIG. 12) is the same as that of the voltage signal 23, which provides for a higher speed of the logic circuit 1. The use of the complement and true outputs of the amplifier 3 (FIG. 5) provides concurrently for the occurrence of both negative and positive feedback in the amplifier 3. When a voltage of positive level is applied to the inputs of the logic arrangement 2, the outputs of the latter provide a signal having a lesser positive level and the amplifier 3 provides for an additional voltage across the resistor 5 which is added to the voltage across the output of the logic arrangement 2. The employment of the amplifier 3 with a positive feedback provides for a reduced loss in the logic arrangement 2.

The operation of the logic circuit 1 shown in FIG. 6 is similar to that described for the embodiments of FIGS. 3, 5.

The operation of the logic circuit 1 may be described in more detail with reference to the circuit diagrams of the embodiments of FIGS. 1–6. For example, the logic circuit 1 of FIG. 7 operates in the following manner. When logic 0 (of a positive voltage level) is applied to one or more inputs of the logic circuit 1 (the inputs of the emitter followers $7_1$–$7_m$), logic 0 appears at the output of the logic circuit 1. The amplifier 3 is driven to conduction and a current from the current source 8 begins to flow through the emitter followers $7_1$–$7_m$. A greatest absolute level of logic 0 is produced when logic 0 is applied only to one input of the logic circuit 1. In this case, the overall current from the current source 8 flows through one of the emitter followers $7_1$–$7_m$ and a maximal voltage drop is created across its emitter-base junction. When logic 0 is applied to all inputs, the current from the current source 8 is distributed between the transistors. A voltage drop across their emitter-base junctions has a lesser value and a voltage level of a lesser absolute value appears at the output of the logic circuit 1. Therefore, logic 0 at one of the inputs of the logic circuit 1 and logic 1's at the remaining inputs are responsible for the most unsatisfactory conditions under which logic 0 at the output of the logic circuit 1 assumes a maximal absolute value of its voltage. When logic 1 is applied to all the inputs of the logic circuit 1 its output provides logic 1.

If no amplifier 3 is available, a current of $I_8/m$ must flow through each emitter follower 7, where m is the number of inputs of the logic circuit 1 and $I_8$ is the current produced by the current source 8. In this case, a decrease of $\Delta U = \gamma_T \ln m$ occurs in the voltage drop across the emitter-base junctions where $\gamma_T$ is the gain temperature coefficient; the voltage level of logic 1 at the output of the logic circuit 1 must be increased by the same value. As a result, the value of the signal passing through the logic circuit 1 is decreased in proportion to the value of natural logarithm of the number of its inputs.

With the amplifier 3 coupled to the output of the logic circuit 1 and with logic 1 applied, the amplifier 3 is brought to conduction and a current of $I_a = I_8(m-1)$ begins to flow through the latter. As a result, each of the emitter followers 7, with logic 1 applied to it, passes a current of $I_8$. The current through any one of the emitter followers $7_1$-$7_m$ does not vary, therefore, in response to variation of the state of the logic circuit 1 and the signal is transferred to its output without loss.

The logic circuit 1 of FIG. 8 operates as follows. The current sources 8 provide for the operating mode of the logic arrangement 2 built around the multi emitter transistor 10. Assume that the source signals 21 (FIG. 12) corresponding, for example, to logic 1's are applied to one or more inputs of the logic arrangement 2. Since the voltage of logic 1 is of a negative value, the current through the multiple emitter transistor 10 tends to increase; as a result, there exists, at its collector-base connection point, a negative voltage whose absolute value is less than that of the source voltage by the value of the loss in the logic arrangement 2 and by the value of the voltage across the emitter-base junction of the multiple emitter transistor 10. That negative voltage is applied to the input of the current switch. The transistor 13 is brought to conduction and a current begins to flow through it and through the resistor 5 with the result that a voltage is produced across the latter with the minus sign at the true output of the amplifier 3. Therefore, a voltage qual to the sum of the voltages at the output of the logic arrangement 2 and across the resistor 5 is provided by the true output of the amplifier 3. The complement output of the current switch provides a voltage corresponding to the voltage of logic 0, which is applied to the complement outputs 9 of the logic circuit 1 via the emitter followers 17 and 18.

With logic 0's applied to all inputs of the logic circuit 1, a voltage corresponding to logic 0 exists in the collector and base of the multiple emitter transistor 10. The parameters of the logic circuit 1 of FIG. 8 are selected so that the voltage across its outputs (with the circuit in the 0 state and with the loss due to the wired AND function taken into consideration) is equal to the voltage corresponding to logic 0's at its inputs.

If this condition is difficult to attain for some reason, then an additional transistor (nor shown in FIG. 8) is inserted between the true output of the current switch and the common bus 12.

The logic circuit 1 of this embodiment can perform a complex function 4AND-4OR/4AND-4OR-Invert at a high operational speed, comprises a small number of components and consumes a low power. However, it cannot realize all the advantages of the disclosed method since there are several drawbacks as follows. First, the transfer of the signal from the output of the logic arrangement 2 to the outputs of the logic circuit 1 is effected via the resistor 5 due to the fact that a relatively large stray capacitance is available for the true output of the amplifier 3. Secondly, connection of the amplifier 3 with a positive feedback to the output of the logic arrangement 2 causes a decrease in the speed of operation of the latter.

The logic circuit 1 of FIG. 10 operates in the following manner. When the source signals corresponding to logic 1 are applied to one or more inputs of the logic circuit 1, the converted signal appears at the collector, and with a small time delay at the base of the multiple emitter transistor 10. The current produced by the voltage source 16 begins to flow through the resistor 5. Since the absolute value of the voltage of the voltage source 16 is selected to be equal to a mid level between the levels "0" and "1" of the signals delivered to the collector of the multiple emitter transistor 10, a voltage is created across the resistor 5 with the minus sign at the base of the multiple emitter transistor 10. There exists a negative voltage across the collector of the transistor 10 which is equal to the sum of the voltages across the base of the transistor 10 and across the resistor 5.

When logic 0 is applied to all inputs of the logic circuit 1, the voltage corresponding to logic 0 is developed across the collector and base of the multiple emitter transistor 10. The voltage across the resistor 5 changes its sign, while the voltage corresponding to logic 0, which is developed across the collector of the transistor 10, becomes equal to the sum of the voltages across its base and across the resistor 5.

The embodiment of FIG. 10 differs from that of FIG. 8 in that the logic signal 24 (FIG. 12) is applied to the true outputs of the logic circuit 1, bypassing the resistor 5. The latter is operated to perform two functions as follows: first, it creates an additional voltage signal 23 for the recovery of the amplitude of the logic signal 22 and, secondly, it provides for a negative feedback between the collector and base of the multiple emitter transistor 10, thereby resulting in a high speed of operation of the logic circuit 1.

The logic circuit 1 of the embodiment possesses a most high operational speed as compared to other embodiments described. It also offers a compact design and includes a small number of components. However, it has no complement output. Moreover, the voltage levels of logic 1 and logic 0 at the output of the logic circuit 1 vary considerably in response to a variation of the same levels at its input. The logic circuit 1 of the embodiment can therefore be used in building logic chains of a shorter length.

The embodiment of FIG. 9 differs from the embodiment of FIG. 10 in that it comprises an additional cutoff-type amplifier 3 (current switch) having its complement output coupled to the base of the multiple emitter transistor 10. The input of the current switch is coupled to the collector of the multiple emitter transistor 10; however, that input can be coupled to the base of the transistor 10 (this variant is not shown in FIG. 9).

When a signal appears at the collector of the multiple emitter transistor 10, it is transferred to the input of the current switch. A voltage developed across the complement output of the current switch and across the resistor 5 is added to a voltage across the base of the transistor 10 with the result that the overall signal is produced by the collector of the transistor 10. The cutoff-type amplifier 3 provides for a considerable improvement of the static characteristics of the logic circuit 1.

The embodiment of FIG. 9, as compared to that of FIG. 10, possesses a somewhat lesser operational speed but better static transfer characteristics, which provides for creation of logic chains of a greater length.

The embodiment of FIG. 11 differs from that of FIG. 10 in that it has the complement output 9 whose amplification capability provides for the recovery of the logic signal at the true output 4 of the logic circuit 1.

When the logic circuit 1 is held in the 1 state related to its true output 4, its complement output 9 provides a voltage corresponding to logic 0 and a current from the output of the emitter follower 17 begins to flow through the resistors 20, 5 and results in a drop of voltage across the resistor 5 with the minus sign at the collector of the multiple emitter transistor 10. When the logic circuit 1 is held in the 0 state related to its true output 4, its complement output 9 provides a voltage corresponding to logic 1 and the current through the resistor 5 changes direction. As a result, the resistor 5 provides a voltage whose plus sign is at the collector of the multiple emitter transistor 10.

The described logic circuit 1 possesses operational speed same as in the case of the embodiment of FIG. 9 but also has an ability to additionally perform the NOT function. The resistor 20 provides for a condition in which the complement signal at the output of the emitter follower 17 is responsible for the recovery of the logic signal 22 at the true output 4.

The proposed method makes it possible to built LSI circuits having an extremely high speed of operation, since logic circuits of type AND, OR, and AND-OR utilizing bipolar transistors may be given an operational speed of a value close to a theoretical limit determined by the threshold frequency, $f_T$, of transistors.

The proposed logic circuits utilize emitter followers and diodes built around multiple emitter transistors to perform functions AND, OR, and AND-OR. As a result, these circuits require low power, comprise small number of components and require small number of insulated packages for mounting in integrated circuits. The proposed logic circuits can perform complex logical functions. All these features provide for the creation of LSI logic circuits possessing an extremely high speed of operation and suitable for use with high performance computers of the fourth generation.

For example, the logic circuit 1 (FIG. 9) performing the 4AND-4OR function utilizes transistors having parameters as follows: $\tau=20$ ps, $C_{EB}=0.3$ pF, $R_B=250$ Ohms, $C_{CS}=0.2$ pF. The time delay of this circuit amounts to 180 ps, which corresponds to less than 100 ps per one gate at a power consumption of 25 mW approx. (6 mW per one gate). The delay time for the logic circuit 1 of FIG. 10 amounts to 120 ps. When loads are connected to the logic circuits 1, the delay time is increased by 50 ps per load.

It is recommended that the disclosed logic circuits be used with LSI circuits, especially with matrix-type ones. The disclosed logic circuits are versatile ones, require small number of logic elements and perform complex logic functions 4AND-4OR/4AND-4OR-Invert. When they are used to perform simple logical functions, such as 2AND, the excessive area is equal to that occupied by a single transistor.

What is claimed is:

1. A logic circuit for performing the AND, OR and AND-OR logic functions, comprising:
   plural logic circuit inputs and true outputs;
   current source means coupled to said logic circuit inputs;
   a first resistor;
   a second resistor;
   a voltage source;
   an output emitter follower comprising an output multiple-emitter transistor having an input and plural outputs, said plural outputs being coupled to said true outputs of said logic circuits; and
   an input multiple-emitter transistor having plural emitters, a base, and a collector, said plural emitters being coupled to said logic circuit inputs, said collector being coupled to said input of said output emitter follower, said base being coupled to said collector via said first resistor and to said voltage source via said second resistor.

2. A logic circuit adapted to perform the AND, OR and AND-OR logic functions, comprising:
   plural logic circuit inputs and true outputs;
   current source means coupled to said logic circuit inputs;
   a first resistor;
   an output emitter follower comprising a multiple-emitter transistor having an input and plural outputs, said plural outputs being coupled to said true outputs of said logic circuit;
   an input multiple-emitter transistor having plural emitters, a base, and a collector, said emitters being coupled to said logic circuit inputs, said collector being coupled to said input of said output emitter follower, said base being coupled via said first resistor to said collector; and
   an amplifier having an amplifier input and true and complement amplifier outputs, said amplifier input being coupled to said collector of said input transistor, said complement amplifier output being coupled to said base of said input transistor.

3. A logic circuit as claimed in claim 2, wherein said true output of said amplifier is coupled to said collector of said input multiple-emitter transistor.

4. A logic circuit adapted to perform the AND, OR, AND-OR, and AND-OR-Invert logic functions, comprising:
   plural logic circuit inputs, true logic circuit outputs, and complement logic circuit outputs;
   current source means coupled to said inputs of said logic circuit;
   a first resistor;
   a second resistor;
   a first output emitter follower comprising a first input multiple-emitter transistor having an input and plural outputs, said plural ouputs being coupled to said true outputs of said logic circuit;
   an input multiple-emitter transistor having plural emitters, a base, and a collector, said plural emitters being coupled to said inputs of said logic circuit, said collector being coupled to said input of said first output emitter follower, said base being coupled via said first resistor with said collector;
   an amplifier having an amplifier input and true and complement amplifier outputs, said amplifier input being coupled to said collector of said input multiple-emitter transistor;
   a second output emitter follower comprising a second output multiple-emitter transistor having an input and plural outputs, said outputs of said second multiple-emitter transistor being coupled to said complement outputs of said logic circuit; and
   a further emitter follower having an input and an output, said further emitter follower being coupled to said complement output of said amplifier, said further emitter follower output being coupled to said base of said intput multiple-emitter transistor coupled via said resistor and to said input of said second output emitter follower.

5. A logic circuit as claimed in claim 4, wherein said true output of said amplifier is coupled to said collector of said input multiple-emitter transistor.

6. A logic circuit adapted to perform the logic function AND comprising:
plural logic circuit inputs and a true output;
plural emitter follower having respective inputs and outputs, said respective inputs being coupled to said inputs of said logic circuits, said outputs being coupled to said true outputs of said logic circuit; and
an amplifier having an input and a true output, both coupled to said true output of said logic circuit.

7. A logic circuit as claimed in claim 6, further comprising a resistor coupled to said outputs of said emitter followers and to said true outputs of said logic circuit.

* * * * *